(12) United States Patent
Ko (10) Patent No.: US 9,307,584 B2
(45) Date of Patent: Apr. 5, 2016

(54) ORGANIC LIGHT EMITTING DISPLAY DEVICE WITH SUBSTANTIALLY POLYGONAL SUB-PIXELS

(71) Applicant: SAMSUNG DISPLAY CO., LTD., Yongin, Gyeonggi-Do (KR)

(72) Inventor: Jung-Woo Ko, Yongin (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 0 days.

(21) Appl. No.: 14/056,926

(22) Filed: Oct. 17, 2013

(65) Prior Publication Data

US 2014/0042887 A1 Feb. 13, 2014
US 2016/0057817 A9 Feb. 25, 2016

Related U.S. Application Data

(63) Continuation of application No. 13/448,947, filed on Apr. 17, 2012, now Pat. No. 8,598,784.

(30) Foreign Application Priority Data

Jun. 30, 2011 (KR) ........................ 10-2011-0065141

(51) Int. Cl.
*H01L 51/50* (2006.01)
*H05B 33/02* (2006.01)
*H01L 27/32* (2006.01)

(52) U.S. Cl.
CPC ............ *H05B 33/02* (2013.01); *H01L 27/3216* (2013.01); *H01L 27/3218* (2013.01)

(58) Field of Classification Search
CPC ....................... H01L 27/3213–27/3218; G09G 3/3208–3/3225

USPC .................................................. 313/500–512
See application file for complete search history.

(56) References Cited

U.S. PATENT DOCUMENTS

| 5,311,337 A | 5/1994 | McCartney, Jr. |
| 6,366,025 B1 | 4/2002 | Yamada |
| 6,867,549 B2 | 3/2005 | Cok et al. |

(Continued)

FOREIGN PATENT DOCUMENTS

| CN | 1376014 A | 10/2002 |
| CN | 1556543 A | 12/2004 |

(Continued)

OTHER PUBLICATIONS

European Office action and Search Report for Patent Application No. 12169499.6, dated Mar. 18, 2014, 8 pages.

(Continued)

*Primary Examiner* — Mariceli Santiago
(74) *Attorney, Agent, or Firm* — Lewis Roca Rothgerber Christie LLP (57) ABSTRACT

An organic light emitting display device includes a plurality of sub-pixels arranged in a substantially hexagonally-shaped structure, each of the sub-pixels including a corresponding one of a plurality of organic light emitting devices, wherein the plurality of sub-pixels includes a plurality of first sub-pixels for emitting light of a first color, a plurality of second sub-pixels for emitting light of a second color, and a plurality of third sub-pixels for emitting light of a third color, and wherein centers of adjacent ones of the first, second, and third sub-pixels form a triangle having one of three sides that is shorter than the other two of the sides.

14 Claims, 5 Drawing Sheets

(56) References Cited

U.S. PATENT DOCUMENTS

| | | | |
|---|---|---|---|
| 7,187,425 B2 | 3/2007 | Yamazaki | |
| 8,232,038 B2 | 7/2012 | Hirakata et al. | |
| 8,598,784 B2* | 12/2013 | Ko | 313/504 |
| 2002/0070909 A1 | 6/2002 | Asano et al. | |
| 2004/0246426 A1 | 12/2004 | Wang et al. | |
| 2005/0134175 A1 | 6/2005 | Chen et al. | |
| 2005/0236968 A1 | 10/2005 | Gunner et al. | |
| 2006/0033422 A1 | 2/2006 | Chao et al. | |
| 2006/0087227 A1* | 4/2006 | Yamanaka | 313/504 |
| 2007/0018911 A1 | 1/2007 | Yim et al. | |
| 2008/0001524 A1 | 1/2008 | Lee et al. | |
| 2008/0158097 A1 | 7/2008 | Guo | |
| 2010/0072882 A1 | 3/2010 | Hwang et al. | |
| 2010/0110048 A1 | 5/2010 | Min et al. | |
| 2010/0127397 A1 | 5/2010 | Chen et al. | |
| 2011/0012820 A1 | 1/2011 | Kim et al. | |
| 2011/0260951 A1* | 10/2011 | Hwang et al. | 345/55 |
| 2011/0260952 A1* | 10/2011 | Hwang et al. | 345/55 |
| 2012/0049726 A1* | 3/2012 | Yoo et al. | 313/504 |
| 2013/0037827 A1* | 2/2013 | Levermore et al. | 257/88 |
| 2013/0038513 A1 | 2/2013 | Park et al. | |
| 2013/0113363 A1* | 5/2013 | Hong | 313/498 |
| 2013/0234917 A1* | 9/2013 | Lee | 345/82 |
| 2014/0003045 A1* | 1/2014 | Lee et al. | 362/231 |

FOREIGN PATENT DOCUMENTS

| | | |
|---|---|---|
| JP | 2004-347930 | 12/2004 |
| KR | 10-2007-0011731 | 1/2007 |
| KR | 10-2007-0031707 A | 3/2007 |
| KR | 10-2011-0006343 A | 1/2011 |

OTHER PUBLICATIONS

KIPO Office action dated Feb. 15, 2013, for Korean priority Patent application 10-2011-0065141, (5 pages).

KIPO Notice of Allowance dated Aug. 13, 2013, for Korean priority Patent application 10-2011-0065141, (2 pages).

SIPO Office action dated Jun. 24, 2015, for corresponding Chinese Patent application 201210214783.4, (9 pages).

* cited by examiner

ORGANIC LIGHT EMITTING DISPLAY DEVICE WITH SUBSTANTIALLY POLYGONAL SUB-PIXELS

CROSS-REFERENCE TO RELATED PATENT APPLICATION

This application is a continuation of U.S. patent application Ser. No. 13/448,947, filed Apr. 17, 2012 which claims priority to and the benefit of Korean Patent Application No. 10-2011-0065141, filed on Jun. 30, 2011, in the Korean Intellectual Property Office, the disclosure of which is incorporated herein in its entirety by reference.

BACKGROUND

1. Field

Embodiments of the present invention relate to an organic light emitting display device.

2. Description of Related Art

Organic light emitting display devices are self-emissive displays that emit light by electrically exciting organic compounds, and are being considered as next generation display devices that may address problems of liquid crystal display devices, as organic light emitting display devices may operate with low voltage, may have a thin profile, and have wide viewing angles and fast response speeds. Therefore, demands for organic light emitting display devices with high resolution are increasing.

A light emission layer in each of sub-pixels that emit light is patterned by colors for realizing full-white color, and to do this, a deposition process using a fine metal mask is performed. However, there is a limitation in finely patterning each of the sub-pixels according to the deposition process using a fine metal mask.

Accordingly, an aperture ratio, which is a ratio of an actual light emitting area to an entire display screen of the organic light emitting display device, is reduced as the resolution of the organic light-emitting display device increases. The reduction of the aperture ratio means that a light emitting area in each of the sub-pixels is reduced, and accordingly, the lifespan of the organic light emitting display device may be degraded.

SUMMARY

Embodiments of the present invention provide an organic light emitting display device with an increased lifespan by increasing an aperture ratio.

Embodiments of the present invention also provide an organic light emitting display device capable of reducing or preventing image quality degradation.

According to an aspect of embodiments of the present invention, there is provided an organic light emitting display device including a plurality of sub-pixels arranged in a substantially hexagonally-shaped structure, each of the sub-pixels including a corresponding one of a plurality of organic light emitting devices, wherein the plurality of sub-pixels includes a plurality of first sub-pixels for emitting light of a first color, a plurality of second sub-pixels for emitting light of a second color, and a plurality of third sub-pixels for emitting light of a third color, and wherein centers of adjacent ones of the first, second, and third sub-pixels form a triangle having one of three sides that is shorter than the other two of the sides.

The three sides of the triangle may have different lengths.

The first color may be green, the second color may be blue, and the third color may be red.

According to another aspect of embodiments of the present invention, there is provided an organic light emitting display device including a plurality of sub-pixels arranged in a substantially hexagonally-shaped structure, each of the sub-pixels including a corresponding one of a plurality of organic light emitting devices, wherein the plurality of sub-pixels includes a plurality of first sub-pixels for emitting light of a first color, a plurality of second sub-pixels for emitting light of a second color, and a plurality of third sub-pixels for emitting light of a third color, wherein sub-pixels of different colors from among the plurality of sub-pixels are adjacent in a first direction and are adjacent in a second direction that is perpendicular to the first direction, and wherein a first center line through centers of the first sub-pixels in the second direction is separated from a second center line through centers of the second sub-pixels in the second direction, the second sub-pixels being adjacent to corresponding ones of the first sub-pixels in the second direction.

A third center line through centers of the third sub-pixels in the second direction may coincide with the second center line, the third sub-pixels being adjacent to corresponding ones of the first sub-pixels in the second direction.

A third center line through centers of the third sub-pixels in the second direction may coincide with the first center line, the third sub-pixels being adjacent to corresponding ones of the first sub-pixels in the second direction.

A third center line through centers of the third sub-pixels in the second direction may be separated from the second center line, the third sub-pixels being adjacent to corresponding ones of the first sub-pixels in the second direction.

A distance between the centers of two of the first sub-pixels that are nearest in the first direction may be shorter than a distance between the centers of two of the second sub-pixels that are nearest in the first direction.

A distance between the centers of two of the first sub-pixels that are nearest in the first direction may be shorter than a distance between the centers of two of the third sub-pixels that are nearest in the first direction.

A distance between the centers of two of the third sub-pixels that are nearest in the first direction may be shorter than a distance between the centers of two of the second sub-pixels that are nearest in the first direction.

The first color may be green, the second color may be blue, and the third color may be red.

According to another aspect of embodiments of the present invention, there is provided an organic light emitting display device including a plurality of sub-pixels arranged in a substantially hexagonally-shaped structure, each of the sub-pixels including a corresponding one of a plurality of organic light emitting devices, wherein the plurality of sub-pixels includes a plurality of first sub-pixels for emitting light of a first color, a plurality of second sub-pixels for emitting light of a second color that is different from the first color, and a plurality of third sub-pixels for emitting light of a third color that is different from the first and second colors, wherein sub-pixels of different colors from among the plurality of sub-pixels are adjacent along a first axis and are adjacent along a second axis that is perpendicular to the first axis, and wherein a width of each of the first sub-pixels along the first axis is narrower than a width of each of the second sub-pixels along the first axis.

The width of one of the first sub-pixels along the first axis may be narrower than a width of the one of the first sub-pixels along the second axis.

Centers of the first sub-pixels in a column arranged along the second axis may be offset along the first axis from centers of the second sub-pixels arranged in the column.

The centers of the first sub-pixels in odd number columns and the centers of the first sub-pixels in even number columns may be shifted in opposite directions along the first axis.

A width of each of the third sub-pixels along the first axis may be narrower than a width of each of the second sub-pixels along the first axis.

The width of one of the third sub-pixels along the first axis may be narrower than a width of the one of the third sub-pixels along the second axis.

Centers of the third sub-pixels in a column arranged along the second axis may be offset along the first axis from centers of the second sub-pixels arranged in the column.

The centers of the third sub-pixels in odd number columns and the centers of the third sub-pixels in even number columns may be shifted along the first axis in opposite directions.

A width of each of the second sub-pixels along the first axis may be narrower than a width of each of the second sub-pixels along the second axis.

The first color may be green, the second color may be blue, and the third color may be red.

BRIEF DESCRIPTION OF THE DRAWINGS

The above and other features and aspects of embodiments of the present invention will become more apparent by describing in detail exemplary embodiments thereof with reference to the attached drawings in which.

DETAILED DESCRIPTION

Hereinafter, embodiments of an organic light emitting display device according to the present invention will be described with reference to accompanying drawings.

Figure 1:
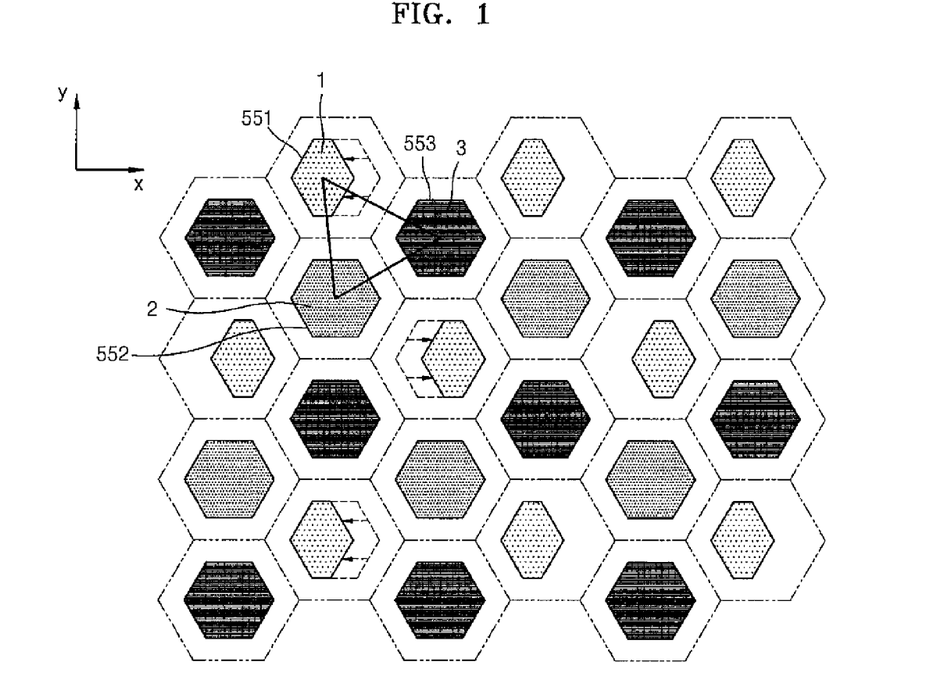
FIG. 1 is a plan view of sub-pixels in an organic light emitting display device according to an embodiment of the present invention.

FIG. 1 is a plan view of sub-pixels in an organic light emitting display device according to an embodiment of the present invention.

Referring to FIG. 1, the organic light emitting display device according to the present embodiment includes sub-pixels, with each of the sub-pixels being substantially hexagon-shaped (e.g., six sided) and arranged in a substantially hexagonal structure.

Each of the sub-pixels includes a pixel circuit including an organic light emitting device and a thin film transistor.

Figure 2:
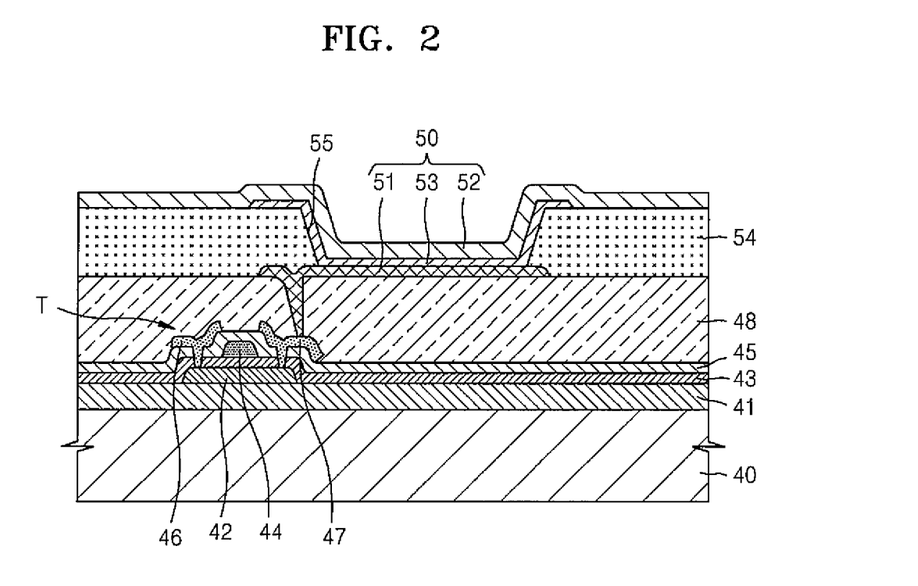
FIG. 2 is a cross-sectional view of one of a plurality of sub-pixels of the embodiment shown in FIG. 1.

FIG. 2 is a cross-sectional view of one of the sub-pixels of the embodiment shown in FIG. 1.

As shown in FIG. 2, a thin film transistor T is formed on a substrate 40, and an organic light emitting device 50 that is electrically coupled to the thin film transistor T is located on the substrate 40.

A buffer layer 41 is formed on the substrate 40, and the thin film transistor T is located on the buffer layer 41.

The buffer layer 41 reduces or prevents impurity elements from penetrating into the substrate 40, and planarizes the surface of the substrate 40. The buffer layer 41 may be formed of various materials. For example, the buffer layer 41 may be formed of an inorganic material, such as silicon oxide, silicon nitride, silicon oxinitride, aluminum oxide, aluminum nitride, titanium oxide, or titanium nitride, may be formed of an organic material, such as polyimide, polyester, or acryl, or may be formed of a stacked structure thereof. However, the buffer layer 41 is not an essential element, that is, the buffer layer 41 is not necessary to practice the embodiments of the present invention.

An active layer 42, which is formed of a semiconductor material, is patterned on the buffer layer 41. The active layer 42 may be formed of polycrystalline silicon; however, the present embodiment is not limited thereto, that is, the active layer 42 may be formed of other materials, such as an oxide semiconductor. For example, the active layer 42 may be a G-I-Z-O layer [e.g., a $(In_2O_3)a(Ga_2O_3)b(ZnO)c$ layer, wherein a, b, and c are respectively real numbers respectively satisfying conditions of a≥0, b≥0, and c>0].

A gate insulating layer 43 is formed on the buffer layer 41 so as to cover the active layer 42, and a gate electrode 44 is formed on the gate insulating layer 43.

An interlayer dielectric 45 is formed on the gate insulating layer 43 so as to cover the gate electrode 44. A source electrode 46 and a drain electrode 47 are formed on the interlayer dielectric 45 to contact the active layer 42 through respective contact holes.

According to the present embodiment, at least one thin film transistor T is located in each of the sub-pixels. In addition, FIG. 2 shows one thin film transistor T; however, the present invention is not limited thereto. That is, a plurality of thin film transistors T may be located in each of the sub-pixels to configure a pixel circuit unit, and the pixel circuit unit may further include a capacitor.

The thin film transistor T is covered by a first insulating layer 48. The first insulating layer 48 is a layer-shaped structure including at least one layer formed on the interlayer dielectric 45, and may be formed of an organic material and/or an inorganic material. The organic material may be, for example, a polymer material such as acryl, polyimide, or polyester, and the inorganic material may be, for example, silicon oxide, silicon nitride, silicon oxinitride, aluminum oxide, aluminum nitride, titanium oxide, or titanium nitride.

A first electrode 51 is formed on the first insulating layer 48. The first electrode 51 is coupled to the drain electrode 47 via a via-hole formed in the first insulating layer 48.

In addition, a second insulating layer 54 is formed on the first insulating layer 48, and the second insulating layer 54 covers an edge of the first electrode 51. The second insulating layer 54 includes an opening 55 exposing a part of the first electrode 51. The second insulating layer 54 may be formed of an organic material such as acryl, polyimide, or polyester; however, the present invention is not limited thereto, that is, the second insulating layer 54 may be formed of an inorganic material or an organic/inorganic compound.

An organic emission layer 53 is formed on the first electrode 51 and the second insulating layer 54 so as to cover the part of the first electrode 51 that is exposed by the opening 55, and a second electrode 52 is formed on the organic emission layer 53 and the second insulating layer 54 so as to cover the organic emission layer 53.

The first electrode 51 is patterned independently on each of the sub-pixels, and the second electrode 52 is formed as a common electrode (e.g., an electrode that covers all the sub-pixels). The opening 55 of the second insulating layer 54 is formed in each of the sub-pixels, and an area of the opening 55 is substantially the same as an area of the light emitting region in the sub-pixel. In the sub-pixel having the hexagonal structure of the embodiment shown in FIG. 1, the opening 55 is formed to have a substantially hexagonal plane shape. The opening 55 and the first electrode 51 do not need to have the same plane shapes, and the first electrode 51 may be formed to have another shape, for example, a triangular or other polygonal shape.

The first electrode 51, the second electrode 52, and the organic emission layer 53 form the organic light emitting device 50.

The first electrode 51 and the second electrode 52 may have polarities that are opposite to each other, that is, may be formed respectively as an anode and a cathode. Alternatively, the first electrode 51 may be a cathode and the second electrode 52 may be an anode.

In any case, the electrode functioning as the anode includes a conductive material having a work function of a high absolute value, and the electrode functioning as the cathode includes a conductive material having a work function of a low absolute value. The conductive material having a high work function may be a transparent conductive oxide material such as, for example, indium tin oxide (ITO), $In_2O_3$, ZnO, or indium zinc oxide (IZO), or a noble metal such as Au. The conductive material having a low work function may be, for example, Ag, Al, Mg, Li, Ca, LiF/Ca, or LiF/Al.

In a top emission type display device in which images are displayed toward a direction away from the substrate 40, the first electrode 51 includes a light reflective material, and the second electrode 52 is a light transmission type electrode.

To do this, when the first electrode 51 functions as the anode, a reflective body is formed of, for example, Ag, Mg, Al, Pt, Pd, Au, Ni, Nd, Ir, Cr, or a compound thereof, and then, ITO, IZO, ZnO, or $In_2O_3$ having the high work function, for example, is deposited on the reflective body. In addition, when the first electrode 51 functions as the cathode, the first electrode 51 is formed of, for example, Ag, Al, Mg, Li, Ca, LiF/Ca, or LiF/Al having low work function and is capable of reflecting light.

When the second electrode 52 functions as the cathode, the second electrode 52 may be formed to be thin for performing as a transflective layer by using a metal material such as, for example, Li, Ca, LiF/Ca, LiF/Al, Al, Mg, or Ag having low work function. The transparent conductive material such as, for example, ITO, IZO, ZnO, or $In_2O_3$ may be deposited on the metal transflective layer to address high resistance caused due to the thinness of the transflective layer. When the second electrode 52 functions as the anode, the second electrode 52 may be formed of, for example, ITO, IZO, ZnO, or $In_2O_3$.

The first and second electrodes 51 and 52 may be formed of various other materials that are known to those of ordinary skill in the art.

The first and second electrodes 51 and 52 apply voltages of opposite polarities to the organic emission layer 53 between the first and second electrodes 51 and 52 to make the organic emission layer 53 emit light.

The organic emission layer 53 may be formed of a low-molecular weight organic material or a high-molecular weight organic material. If a low-molecular weight organic material is used, then the organic emission layer 63 may have a single or multi-layer structure including at least one selected from the group consisting of a hole injection layer (HIL), a hole transport layer (HTL), an emission layer (EML), an electron transport layer (ETL), and an electron injection layer (EIL). Examples of available organic materials may include, for example, copper phthalocyanine (CuPc), N,N'-di(naphthalene-1-yl)-N,N'-diphenyl-benzidine (NPB), tris-8-hydroxyquinoline aluminum (Alq3), and the like. Such a low-molecular weight organic material may be deposited by vacuum deposition.

If a high-molecular weight organic material is used, the organic emission layer 53 may have a structure including the HTL and EML. Here, the HTL may be formed of, for example, poly(3,4-ethylenedioxythiophene) (PEDOT), and the EML may be formed of, for example, a polymer organic material based on PolyPhenylene Vinylene (PPV) and Polyfluorene in a screen printing method or an inkjet printing method.

The organic emission layer 53 is not limited to the above examples, and other examples may be applied.

FIG. 1 is a plan view of the sub-pixels of the above cross-sectional structures.

The organic light emitting display device of the present embodiment includes a plurality of sub-pixels as shown in FIG. 1.

The plurality of sub-pixels include a plurality of first sub-pixels 1 for emitting light of a first color, a plurality of second sub-pixels 2 for emitting light of a second color that is different from the first color, and a plurality of third sub-pixels 3 for emitting light of a third color that is different from the first and second colors.

The first through third colors may mix to emit white light, and in the present embodiment, the first through third colors may be respectively green, blue, and red. However, the present invention is not limited thereto, that is, the first through third colors may be, for example, yellow, cyan, and magenta, respectively.

In the present embodiment, the first color is a color having high color perception. When the sub-pixels emit the green, blue, and red lights, the green color is the most recognizable color to humans, and thus, the first color is green.

When the sub-pixels include green, blue, and red sub-pixels, the organic light emitting material forming the blue sub-pixels, that is, the second color, has the shortest lifespan from among the three colors.

Each of the sub-pixels is hexagonally shaped, and the sub-pixels are arranged with a substantially hexagonal structure. The hexagonal structure corresponds to the plane shape of the opening 55 formed in the second insulating layer 54 shown in FIG. 2.

Therefore, each of the first sub-pixels 1 has a first opening 551 formed as a hexagon, each of the second sub-pixels 2 has a second opening 552 formed as the hexagon, and each of the third sub-pixels 3 has a third opening 553 formed as a hexagon. Therefore, the light emission region of the first sub-pixel 1 corresponds to the first opening 551, the light emission region of the second sub-pixel 2 corresponds to the second opening 552, and the light emission region of the third sub-pixel 3 corresponds to the third opening 553.

With respect to embodiments of the present invention, descriptions about the first sub-pixel 1 through the third sub-pixel 3 are for the light emission regions of the sub-pixels 1 through 3, and actually, the regions corresponding to the first through third openings 551 through 553.

In the embodiment of the present invention shown in FIG. 1, the sub-pixels are arranged in a substantially hexagonal shape, and thus, the sub-pixels are arranged in zigzags when viewed along a first direction (e.g., along the x-axis, or in the x direction depicted in FIG. 1) that is a transverse direction, while the sub-pixels are arranged linearly when viewed along a second direction (e.g., along the y-axis, or in the y direction depicted in FIG. 1) that is a longitudinal direction that is perpendicular to the first direction. In addition, the first sub-pixel 1, the second sub-pixel 2, and the third sub-pixel 3 are sequentially arranged in a straight line along the second direction (y direction), and other ones of the first through third sub-pixels 1 through 3 are sequentially arranged in a straight line along the second direction (y direction) that is adjacent to the above line in the first direction (x direction). Here, around a given sub-pixel, only sub-pixels of different colors are arranged, and thus, centers of the first sub-pixel 1, the second sub-pixel 2, and the third sub-pixel 3 that are adjacent to each other form a triangle.

According to the sub-pixels arranged in a hexagonal shape, the aperture ratio is greater than a structure in which the sub-pixels are arranged in a rectangular shape. Therefore, according to the present embodiment, an aperture ratio that is higher than that of an organic light emitting display device including sub-pixels arranged in a rectangular shape may be obtained.

In the above arrangement of the sub-pixels, the sub-pixels of one color are arranged at every other pixel along the first direction (x direction), and at every third sub-pixel along the second direction (y direction). Therefore, a user recognizes that one color is arranged in zigzag along the second direction (y direction) that is the longitudinal direction.

According to the embodiment illustrated in FIG. 1, a width of the first sub-pixel 1 is narrower than those of the second sub-pixel 2 and the third sub-pixel 3 in the first direction (x direction). Therefore, the width of the first sub-pixel 1 in the first direction (x direction) is narrower than the width of the first sub-pixel 1 in the second direction (y direction).

Here, centers of the first sub-pixels 1 arranged in the second direction (y direction) are shifted to a side in the first direction (x direction) with respect to a second center line through centers of the second sub-pixels. A first center line that couples the centers of the first sub-pixels 1 arranged in the second direction (y direction) (e.g., a vertical line that passes through centers of first sub-pixels 1) is separated from the second center line that couples the centers of the second sub-pixels 2 arranged in the second direction (y direction) (e.g., a vertical line that passes through centers of second sub-pixels 2), the second sub-pixels 2 being adjacent to the first sub-pixels 1 in the second direction (y direction) (e.g., the first and second sub-pixels 1 and 2 being in a same column of pixels).

That is, a column of the first sub-pixels 1 arranged in the second direction (y direction) and another column of the first sub-pixels 1 adjacent to the above column in the first direction (x direction) are shifted in opposite directions (e.g., opposite directions of the x direction). Therefore, as shown in FIG. 1, the first sub-pixels 1 in the first column from the left and the first sub-pixels 1 in the second column from the left are shifted to face each other. That is, as shown in FIG. 1, the first sub-pixels 1 in odd number columns are shifted to the right, and the first sub-pixels 1 in even number columns are shifted to the left.

Centers of adjacent ones of the first through third sub-pixels 1 through 3 form a triangle. Here, one side of the triangle is shorter than the other sides of the triangle. According to the embodiment shown in FIG. 1, three sides of the triangle have different lengths.

Figure 3:
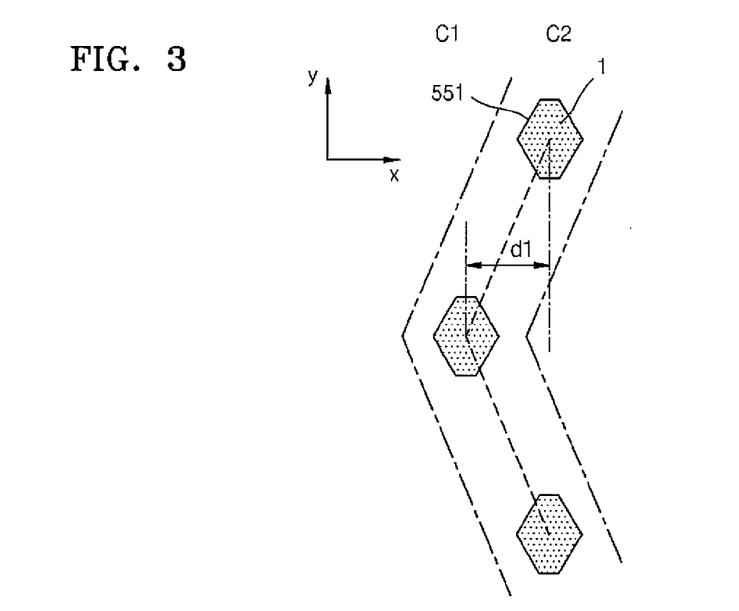
FIG. 3 is a plan view of first sub-pixels in one column from among the sub-pixels of the embodiment shown in FIG. 1.
Figure 4:
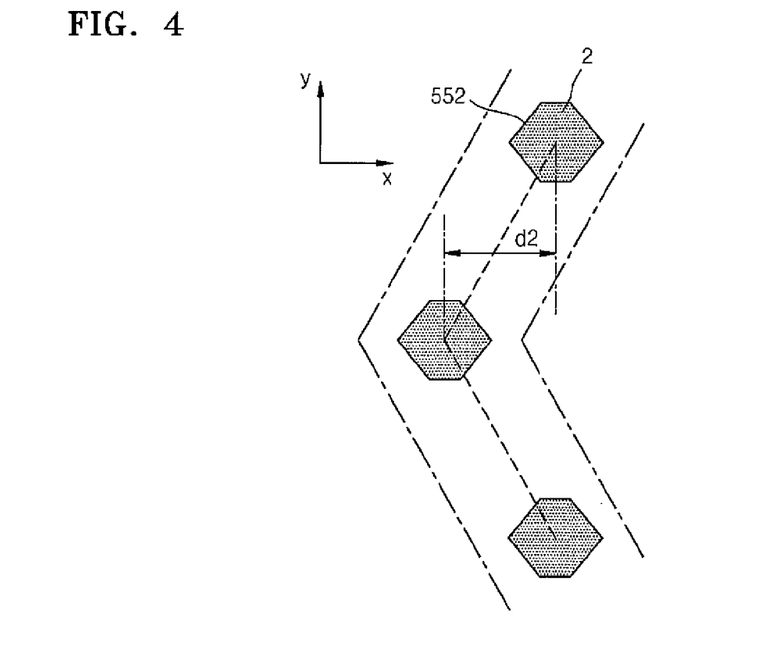
FIG. 4 is a plan view of second sub-pixels in one column from among the sub-pixels of the embodiment shown in FIG. 1.

Referring to FIGS. 3 and 4, according to the above-described structure, a horizontal distance d1 between two adjacent first sub-pixels 1 is shorter than a horizontal distance d2 between two adjacent second sub-pixels 2. Here, the horizontal distances d1 and d2 are distances in the first direction (x direction).

As described above, the first sub-pixels 1 are the sub-pixels emitting the green light and have high color perception to humans. Therefore, when the horizontal distance d1 between the centers of the two adjacent first sub-pixels 1 is reduced, a width of the zigzag pattern of the first sub-pixels 1 arranged in the second direction (y direction) is narrower than that of the second sub-pixels 2 shown in FIG. 4, and thus, the zigzag pattern of the first sub-pixels 1 is more nearly straight. That is, the green sub-pixels that largely affect perception quality are arranged nearly in a straight line, and thus, degradation of image quality may be reduced or prevented.

The image quality may be improved without reducing the distances between openings formed in a second insulating layer in a conventional sub-pixel arrangement as shown in FIG. 1, and thus, processing margin may be ensured.

The arrangement structure of the first sub-pixels 1 may be formed by changing the sizes and locations of the first openings 551 formed in the second insulating layer 54 without changing a size of the first electrode in each of the sub-pixels, and without changing a structure of the pixel circuit unit.

Therefore, all fabrication processes of the organic light emitting display device may be performed without being changed.

Figure 5:
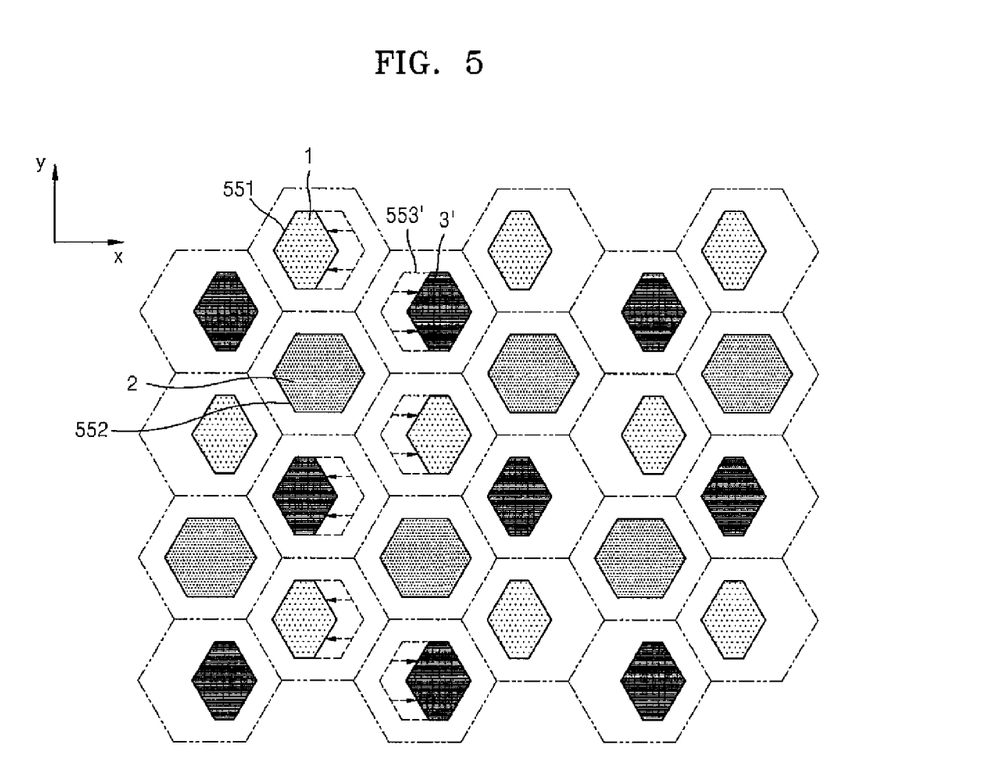
FIG. 5 is a plan view of sub-pixels in an organic light emitting display device according to another embodiment of the present invention.

FIG. 5 shows sub-pixels according to another embodiment of the present invention, in which third sub-pixels 3' are modified in a manner similar to the first sub-pixels 1 described above.

That is, a width of the third sub-pixel 3' is reduced to be narrower than a width of the second sub-pixel 2 in the first direction (x direction). Therefore, the width of the third sub-pixel 3' in the first direction (x direction) is narrower than the width of the third sub-pixel 3' in the second direction (y direction).

Here, centers of the third sub-pixels 3' arranged in the second direction are shifted to a side in the first direction (x direction). The first center line coupling the centers of the first sub-pixels 1 along the second direction (y direction), and a third center line coupling centers of the third sub-pixels 3' along the second direction (y direction), the third sub-pixels 3' being adjacent to the first sub-pixels 1 along the second direction (y direction), coincide with each other. In addition, the first center line and the third center line are separated from the second center line coupling the centers of the second sub-pixels 2 along the second direction (y direction), the second sub-pixels 2 being adjacent to the first sub-pixels 1 along the second direction (y direction).

That is, a column of the third sub-pixels 3' arranged in the second direction (y direction) and another column of the third sub-pixels 3' that is adjacent in the first direction (x direction) to the above column are shifted in opposite directions (e.g.,. opposite directions along the x-axis). Therefore, the third sub-pixels 3' in the first and second columns from the left in FIG. 5 are shifted to face each other. That is, as shown in FIG. 5, the third sub-pixels 3' in odd number columns are shifted to the right, and the third sub-pixels 3' in even number columns are shifted to the left.

Here, centers of the first through third sub-pixels 1, 2, and 3' that are adjacent to each other form a triangle having three sides of different lengths.

In addition, a horizontal distance between centers of two adjacent third sub-pixels 3' is shorter than a horizontal distance between centers of two adjacent second sub-pixels 2.

In FIG. 5, sizes of the third sub-pixels 3' are reduced in the same pattern as the first sub-pixels 1; however, the present invention is not limited thereto. That is, the sizes and locations of the third sub-pixels 3' may be changed regardless of the pattern of the first sub-pixels 1, and the first center line and the third center line need not coincide with each other.

According to the present embodiment, the third sub-pixels 3', as well as the first sub-pixels 1, are arranged in nearly straight lines in the second direction (y direction), and thus, the image quality may be further improved. In addition, disadvantages of the hexagonal sub-pixel structure may be avoided, while still maintaining the advantages of the hexagonal sub-pixel structure.

Figure 6:
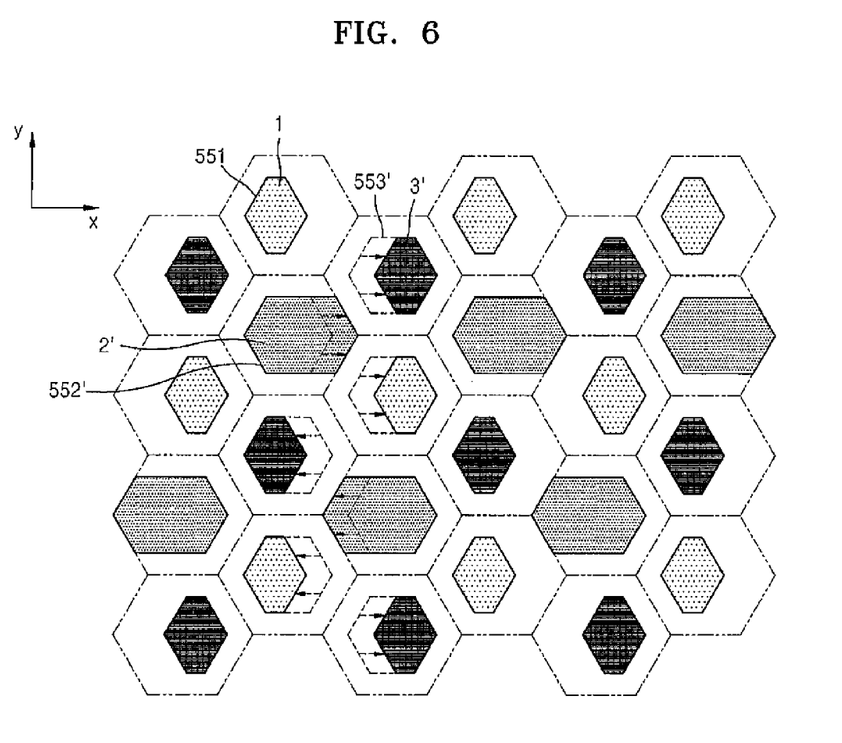
FIG. 6 is a plan view of sub-pixels in an organic light emitting display device according to yet another embodiment of the present invention.

FIG. 6 shows sub-pixels according to another embodiment of the present invention, in which structures of second sub-pixels 2' are changed in addition to the sub-pixels 1 and 3' of the embodiment of FIG. 5.

In the case of the second sub-pixels 2' emitting the blue light, the brightness of the light emitted from the second sub-pixels 2' may be degraded due to the short lifespan of the blue emitting material. Therefore, as shown in FIG. 6, if the sizes of the second sub-pixels 2' are increased by an amount equal to the amount that the reduced sizes of the first sub-pixels 1 and the third sub-pixels 3' are decreased, the blue emission area increases, and thus, the lifespan degradation of the blue emitting material and the brightness degradation may be reduced.

That is, as shown in FIG. 6, a width in the first direction (x direction) of the second sub-pixel 2' of the present embodiment is increased to be wider than the width of the second sub-pixel 2 in the first direction (x direction) of the embodiments shown in FIGS. 1 and 5. Therefore, the width of the second sub-pixel 2' in the first direction (x direction) may be greater than a width of the second sub-pixel 2' in the second direction (y direction).

Here, the first center line coupling the centers of the first sub-pixels 1 along the second direction (y direction), and the third center line coupling the centers of the third sub-pixels 3' in the second direction (y direction), coincide with each other, the third sub-pixels 3' being adjacent to the first sub-pixels 1' along the second direction (y direction) (e.g., the third sub-pixels 3' being in the same column as the first sub-pixels 1). In addition, the first center line and the third center line are separated from the second center line coupling the centers of the second sub-pixels 2' in the second direction (y direction), the second sub-pixels 2' being adjacent to the first sub-pixels 1 along the second direction (y direction) (e.g., the second sub-pixels 2' being in the same column as the first sub-pixels 1).

Since the second sub-pixel 2' emitting the blue light least affects the display image quality even when the sizes of the second sub-pixels 2' are increased, the image quality of the entire display device is not greatly reduced.

In addition, since the sizes of the second sub-pixels 2' are increased as much as the reduced sizes of the first sub-pixels 1 and the third sub-pixels 3' are decreased, the distances between the first openings 551 through the third openings 553' formed in the second insulating layer 54 are not decreased, and accordingly, a processing margin may be maintained to be the same as a conventional organic light emitting display device.

According to the present embodiment, the first and the third sub-pixels are arranged in patterns that are nearly in straight lines in the second direction, an image quality may be improved, and the lifespan of the second sub-pixels may be increased.

The above-described pixel structure of the present embodiment is not limited to the sub-pixels having hexagonal plane structures as shown in FIGS. 1 and 3 through 6, and may be applied to the sub-pixels having circular, oval, square, or other polygonal plane shapes. However, in the above cases, the sub-pixels of different colors are adjacent to each other in the first direction and the second direction.

According to embodiments of the present invention, the following effects may be obtained:

Since sub-pixels having substantially hexagonal structures are formed, the aperture ratio may be improved, and the lifespan of an organic light emitting display device is also increased;

The first sub-pixels emitting the green light are arranged in a pattern that is nearly in a straight line in the longitudinal direction, thus reducing or preventing degradation of image quality;

In addition, distances between openings formed in a second insulating layer are not reduced, and thus, a processing margin may be ensured;

In addition, the third sub-pixels, as well as the first sub-pixels, are arranged in the pattern that is nearly in a straight line in the longitudinal direction, and thus, image quality may be further improved, and the disadvantages of the hexagonal sub-pixel structure may be avoided while improving the advantages of the hexagonal sub-pixel structure;

By increasing the sizes of the second sub-pixels emitting the blue light, the lifespan of the second sub-pixels emitting the blue light may be increased, and brightness degradation may be reduced or prevented;

In addition, the sizes of the second sub-pixels are increased as much as the sizes of the first sub-pixels and the third sub-pixels are decreased, and thus, the distances between the first through second openings formed in the second insulating layer, and accordingly, a processing margin, may remain unchanged.

While the present invention has been particularly shown and described with reference to exemplary embodiments thereof, it will be understood by those of ordinary skill in the art that various changes in form and details may be made therein without departing from the spirit and scope of the present invention as defined by the following claims, and equivalents thereof.

What is claimed is:

1. An organic light emitting display device comprising:
a plurality of sub-pixels, at least one of the sub-pixels being a substantially polygon-shaped, each of the sub-pixels comprising a corresponding one of a plurality of organic light emitting devices,
wherein the plurality of sub-pixels comprises:
a plurality of first sub-pixels for emitting light of a first color;
a plurality of second sub-pixels for emitting light of a second color; and
a plurality of third sub-pixels for emitting light of a third color, and
wherein centers of adjacent ones of the first, second, and third sub-pixels having no intervening sub-pixels therebetween form a triangle having one of three sides that is different from the other two of the sides,
wherein the plurality of sub-pixels are arranged in first and second columns along a first direction, each of the columns extending in a second direction substantially perpendicular to the first direction and having only one of the sub-pixels in each row, each of the first columns comprising at least one of the first sub-pixels, each of the second columns comprising at least one of the second sub-pixels and at least one of the third sub-pixels, and wherein the organic light emitting devices in each of the first columns do not overlap along the second direction with the organic light emitting devices in any of the second columns.

2. The organic light emitting display device of claim 1, wherein the first color is green, the second color is blue, and the third color is red.

3. The organic light emitting display device of claim 1, wherein the centers of the first sub-pixels are arranged along the first direction with no intervening portion of the second sub-pixels or the third sub-pixels therebetween.

4. An organic light emitting display device comprising:
a plurality of sub-pixels, at least one of the sub-pixels being a substantially hexagonally-shaped, each of the sub-pixels comprising a corresponding one of a plurality of organic light emitting devices,
wherein the plurality of sub-pixels comprises:
  a plurality of first sub-pixels for emitting light of a first color;
  a plurality of second sub-pixels for emitting light of a second color; and
  a plurality of third sub-pixels for emitting light of a third color,
wherein the sub-pixels are adjacent differently colored ones of the sub-pixels in a first direction and are adjacent differently colored ones of the sub-pixels in a second direction that is different from the first direction, and
wherein the first, second, and third sub-pixels are arranged in a column direction, and
wherein a first center line in the column direction through centers of aligned ones of the first sub-pixels in a column is separated from a second center line in the column direction through centers of aligned ones of the second sub-pixels in the column, the aligned ones of the second sub-pixels being adjacent corresponding ones of the aligned ones of the first sub-pixels in the second direction.

5. The organic light emitting display device of claim 4, wherein a third center line through centers of aligned ones of the third sub-pixels that are aligned in the second direction is separated from the first center line, the aligned ones of the third sub-pixels being adjacent corresponding ones of the aligned ones of the first sub-pixels in the second direction.

6. The organic light emitting display device of claim 4, wherein a distance between the centers of two of the first sub-pixels that are nearest in the first direction is shorter than a distance between the centers of two of the second sub-pixels that are nearest in the first direction.

7. The organic light emitting display device of claim 4, wherein a distance between the centers of two of the first sub-pixels that are nearest in the first direction is shorter than a distance between the centers of two of the third sub-pixels that are nearest in the first direction.

8. The organic light emitting display device of claim 4, wherein a distance between the centers of two of the third sub-pixels that are nearest in the first direction is shorter than a distance between the centers of two of the second sub-pixels that are nearest in the first direction.

9. The organic light emitting display device of claim 4, wherein the first color is green, the second color is blue, and the third color is red.

10. An organic light emitting display device comprising:
a plurality of sub-pixels, at least one of the sub-pixels being a substantially hexagonally-shaped, each of the sub-pixels comprising a corresponding one of a plurality of organic light emitting devices,
wherein the plurality of sub-pixels comprises:
  a plurality of first sub-pixels for emitting light of a first color;
  a plurality of second sub-pixels for emitting light of a second color; and
  a plurality of third sub-pixels for emitting light of a third color,
wherein the sub-pixels are adjacent differently colored ones of the sub-pixels in a first direction and are adjacent differently colored ones of the sub-pixels in a second direction that is different from the first direction,
wherein the first, second, and third sub-pixels are arranged in a column direction, and
wherein a first center line in the column direction through centers of the first sub-pixels in a column is separated from a second center line in the column direction through centers of the second sub-pixels in the column, the second sub-pixels being adjacent corresponding ones of the first sub-pixels in the second direction,
wherein a third center line in the column direction through centers of aligned ones of the third sub-pixels coincides with the second center line, the aligned ones of the third sub-pixels being adjacent corresponding ones of the aligned ones of the first sub-pixels in the second direction.

11. An organic light emitting display device comprising:
a plurality of sub-pixels, at least one of the sub-pixels being a substantially hexagonally-shaped, each of the sub-pixels comprising a corresponding one of a plurality of organic light emitting devices,
wherein the plurality of sub-pixels comprises:
  a plurality of first sub-pixels for emitting light of a first color;
  a plurality of second sub-pixels for emitting light of a second color that is different from the first color; and
  a plurality of third sub-pixels for emitting light of a third color that is different from the first and second colors,
wherein sub-pixels of different colors from among the plurality of sub-pixels are adjacent along a first direction and are adjacent along a second direction that is at an angle to the first direction,
wherein the first, second, and third sub-pixels are arranged in a column direction, and
wherein a first center line in the column direction through centers of the first sub-pixels in a column is separated from a second center line in the column direction through centers of the second sub-pixels in the column, the second sub-pixels being adjacent corresponding ones of the first sub-pixels in the second direction, and
wherein a width of each of the first sub-pixels along the first direction is narrower than a width of each of the second sub-pixels along the first direction.

12. The organic light emitting display device of claim 11, wherein a width of one of the first sub pixels along the first direction is narrower than a width of the one of the first sub pixels along the second direction.

13. The organic light emitting display device of claim 11, wherein a width of each of the third sub-pixels along the first direction is narrower than a width of each of the second sub-pixels along the first direction.

14. The organic light emitting display device of claim 11, wherein the first color is green, the second color is blue, and the third color is red.

\* \* \* \* \*